United States Patent [19]
Prentice et al.

[11] Patent Number: 6,069,377
[45] Date of Patent: May 30, 2000

[54] IMAGE SENSOR INCORPORATING SATURATION TIME MEASUREMENT TO INCREASE DYNAMIC RANGE

[75] Inventors: Wayne E. Prentice, Honeoye Falls; Robert M. Guidash, Rochester, both of N.Y.

[73] Assignee: Eastman Kodak Company, Rochester, N.Y.

[21] Appl. No.: 09/311,529

[22] Filed: May 13, 1999

[51] Int. Cl.[7] .......................... H01L 31/062; H01L 29/00
[52] U.S. Cl. .................. 257/292; 257/291; 257/532; 250/214 A; 250/214 LA
[58] Field of Search ...................... 257/292, 291, 257/532; 250/559.2, 559.39, 214 LA, 214 A

[56] References Cited

U.S. PATENT DOCUMENTS

| | | | |
|---|---|---|---|
| 4,399,464 | 8/1983 | Hix et al. | 358/213 |
| 4,479,062 | 10/1984 | Kawasaki et al. | 250/578 |
| 4,544,848 | 10/1985 | Kawasaki et al. | 250/578 |
| 4,623,927 | 11/1986 | Hoshino | 358/213 |
| 5,034,601 | 7/1991 | Fukuyama | 250/214 R |
| 5,182,658 | 1/1993 | Ishizaki et al. | 358/483 |
| 5,594,501 | 1/1997 | Suzuki | 348/362 |
| 5,627,620 | 5/1997 | Iwasaki | 396/233 |
| 5,642,163 | 6/1997 | Watari et al. | 348/297 |
| 5,650,643 | 7/1997 | Konuma | 257/225 |
| 5,652,925 | 7/1997 | Aoyagi et al. | 396/96 |
| 5,768,540 | 6/1998 | Iwasaki | 396/234 |
| 5,771,411 | 6/1998 | Iwasaki | 396/96 |
| 5,973,314 | 10/1999 | Shodo | 250/214 R |
| 5,994,689 | 11/1999 | Charrier | 250/214 A |

*Primary Examiner*—Ngân V. Ngô
*Attorney, Agent, or Firm*—James D. Leimbach

[57] ABSTRACT

A semiconductor based image sensor having a timer that is associated with each photosite in the image sensor; and measuring the integration period of that photosite using the timer. Additionally, an imager sensor that does not require an A/D converter but instead uses a comparator circuit to determine when a predetermined threshold has been reached, thus reading as discrete amounts of stored charge which converts directly into a digital representation.

11 Claims, 7 Drawing Sheets

COMBINED TIME SIGNAL
AND PD SIGNAL
OUTPUT COLUMN BUSS

IMAGE SENSOR INCORPORATING SATURATION TIME MEASUREMENT TO INCREASE DYNAMIC RANGE

FIELD OF THE INVENITON

The present invention pertains to semiconductor based image sensors and more particularly to image sensors having increased dynamic range

BACKGROUND OF THE INVENTION

APS are solid state imagers where each pixel contains a photosensing means and other active components creating a charge that is converted to a voltage or current. The signal represents the amount of light incident upon a pixel photosite. The dynamic range (DR) of an imaging sensing device is defined as the ratio of the effective maximum detectable signal level, typically referred to as the saturation signal, ($V_{sat}$), with respect to the rms noise level of the sensor, ($\sigma_{noise}$). This is shown in equation 1.

$$\text{Dynamic Range} = V_{sat}/\sigma_{noise} \qquad \text{Equation 1}$$

Image sensor devices such as charge coupled devices (CCD) that integrate charge created by incident photons have dynamic range limited by the amount of charge that can be collected and held in a given photosite, ($V_{sat}$). For example, for any given CCD, the amount of charge that can be collected and detected in a pixel is proportional to the pixel area. Thus for a commercial device used in a megapixel digital still camera (DSC), the number of electrons representing Vsat is on the order of 13,000 to 20,000 electrons. If the incident light is very bright and creates more electrons that can be held in the pixel or photodetector, these excess electrons are extracted by the anti-blooming means in the pixel and do not contribute to an increased saturation signal. Hence, the maximum detectable signal level is limited to the amount of charge that can be held in the photodetector or pixel. The DR is also limited by the sensor noise level, $\sigma_{noise}$. Due to the limitations on Vsat, much work has been done in CCD's to decrease $\sigma_{noise}$ to very low levels. Typical commercial megapixel DSC devices have a DR of 1000:1 or less.

The same limitations on DR exist is for APS devices. The $V_{sat}$ is limited by the amount of charge that can be held and isolated in the photodetector. Excess charge is lost. This can become even more problematic with APS compared to CCD due to the active components in the APS pixel limiting the area available for the photodetector, and due to the low voltage supply and clocks used in APS devices. In addition, since APS devices have been used to provide image sensor systems on a chip, the digital and analog circuits used on APS devices such as timing and control and analog to digital conversion, that are not present on CCD's, provide a much higher noise floor on APS devices compared to CCD. This is due to higher temporal noise as well as possibly quantization noise from the on-chip analog to digital converter.

U.S. Pat. No. 5,650,643 issued to Konuma (Konuma) teaches a device that can be used to increase the dynamic range of solid state image sensing devices. Konuma shows a means to increase the effective $V_{sat}$ level by incorporating a comparator and a counter associated with a photodetector to measure the time required to reach an integrated signal threshold level, and provide this as the only sensor output. The counter is used in conjunction with the comparator to determine the number of counter clock periods that it took the photodetector to reach the signal level of that supplied to the comparator input. The device then provides only the number of counter clock periods as an output or signal value associated with the photodetector.

While the disclosure of Konuma does provide increased dynamic range through effectively increasing $V_{sat}$, this approach has several problems.

First, if one were to have a counter and comparator in each pixel, the number of components in each pixel is very large leading to a pixel with a very small fill factor or a very large pixel. This approach is not practical given the present minimum feature sizes of state of the art semiconductor technology, and the need for small pixel, low cost image sensors.

Second, the output for each pixel is a counter value for the time required to reach a given threshold, and does not contain an analog output value for the actual amount of charge integrated in the photodetector. With this approach, although the effective $V_{sat}$ level is increased, the effective DR will be limited by the time period or accuracy of the counter clock, and the size of the counter. For example, if the counter has 10 bits or 1024 counts, the dynamic range is extended to 10 bits provided that the 1024 master clock periods can fit into the desired exposure time. If the desired exposure time were 100 msec., then the counter clock period must be $\leq 97.6$ usec. If one were try to extend the DR to 20 bits, a 20 bit counter would be required, and a counter clock frequency of >10.5 MHz for an exposure time of 100 msec. As the exposure time decreases a commensurately faster master clock is required. For example, if an exposure time of $\frac{1}{60}^{th}$ of a second were desired or required in the case of capturing an image in outdoors in bright sunlight, a master clock of 63 MHz would be required to quantize 20 bits. It is evident that very fast counter clocks are required to provide high dynamic range in typical exposure conditions. Also, as the number of bits in the counter gets larger, more area required to integrate this into the pixel, producing a larger and larger pixel. Typical counters require 4–8 transistors per bit. Thus a 20 bit counter would require 80–160 transistors, yielding pixel sizes of >40 um in a 0.35 um CMOS process. Additionally this approach requires that all pixels within the image sensor reach the programmed threshold level in order to have an output value for each pixel. This would require very long exposure times to allow dark regions of the scene to reach the threshold level if the threshold level is near $V_{sat}$. The exposure times could be decreased by programming the threshold level to a very low value, but this would reduce the accuracy of information in very bright regions of the scene since they will reach the threshold value in extremely short time periods.

Thirdly, with the approach of Konuma, at the brightest light levels the data is more quantized. This is shown is FIG. 2. This can be seen by looking at how the effective light measurement is calculated from the time to threshold.

If one knows the amount of time ($t_T$) required to reach a threshold ($V_T$) and assume that the source is constant over the time being measured, then one can calculate the amount of light at any arbitrary time, ($t_M$). The expression for the extended effective voltage ($V_{ext}$) is given by Equation 2 below.

$$\text{Equation 2: } V_{ext} = \frac{V_T \cdot t_M}{t_T}$$

In a discrete system the time variable, $t_T$, would be measured by a quantized unit as indicated in Equation 3.

$$\text{Equation 3: } t_T = \frac{t_M \cdot cv}{MaxCv}$$

Where cv is the quantized integer code value and MaxCv is the code value that corresponds to the cv value at $t_M$. Substituting values we arrive at Equation 4.

$$\text{Equation 4: } V_{ext} = \frac{V_T \cdot MaxCv}{cv}$$

Referring to FIG. 2, a code value (cv) of zero implies infinite light. The first measurable quantization, which is also the largest, is between cv=1 and cv=2. The quantization for an 8 bit linear system is 0.0039, which is less than the smallest quantization in a time to threshold method described by Konuma.

Fourthly, if one were to have a single counter and comparator used outside of the pixel array to keep track of the time to threshold, each pixel would then have to be measured at an extremely high rate in order to have a small enough sampling frequency per pixel to provide fine enough quantization for extension of the dynamic range. For example, assume that 10 bits of quantization over the desired exposure time is required, and that there are 1 million pixels in the image sensor. Given a desired exposure time of 100 msec., each pixel would have to accessed and measured against the programmed threshold level every 97.65 usec. This means that 1 million pixels need to be sampled every 97.65 usec. This would require a pixel sampling rate of 1 pixel per 97.65 psec, or 10.24 GHz. A means for doing this has not been disclosed by Konuma or elsewhere in the field of APS or other image sensor devices.

Finally, the output value provided is a time. In order to reconstruct the incident image from this output, (i.e. determine the signal level), one must extrapolate by multiplication from the time value. This can degrade the effective noise level of the sensor. The value t is used to measure the time for a voltage v(t) to reach to a threshold. The signal VPD(t) represents the accumulation of photons over time with some Gaussian additive noise with a standard deviation of $\sigma_v$. One experienced in the art can show that the noise in the extended voltage domain ($\sigma_{Ext}$) is related to the additive noise as indicated by Equation 5.

$$\text{Equation 5: } \sigma_{Ext} = \frac{2 \cdot \sigma_v \cdot t_M \cdot V_T^2}{t_T \cdot (V_T^2 - \sigma_v^2)}$$

Given that $t_M$ is always greater than $t_T$ one can see that the value of $\sigma_{Ext}$ is always greater than $\sigma_v$. From the foregoing discussion it should be apparent that there remains a need within the prior art for a device that retains provides extended $V_{sat}$ and dynamic range while retaining low noise, small pixel, simple and low frequency readout, and means to manage the quantization of extended voltage signals.

SUMMARY OF THE INVENTION

The present invention addresses the aforementioned needs in the prior art by providing (1) a small pixel extended dynamic range APS that provides the analog signal levels indicative both of the charge integrated in the photodetector and the time required to reach a programmed signal level within the photodetector, without the need to provide a counter within each pixel; and (2) an extended dynamic range APS that provides both the analog signal levels indicative of the charge integrated in the photodetector and a signal indicative of the number of times that a given pixel reached a programmed threshold level within the integration period.

In the first embodiment, a storage capacitor is included within each pixel, and is connected to a global voltage buss that supplies a time dependent voltage to the pixel array. The storage capacitor in any given pixel is disconnected from the time dependent voltage buss when the signal level in the photodetector reaches a programmed threshold level. The voltage stored on the capacitor is then indicative of the time required for that pixel to reach the programmed threshold level. The pixel also has a photodetector signal readout path, so that both the analog signal indicative of time to threshold and the analog signal indicative of the charge integrated in the photodetector can be read out at the end of the desired exposure time. These 2 analog signals are used in conjunction to provide extended dynamic range. A counter is not integrated in the pixel so the pixels can be made practically small.

In the second embodiment, a new concept is provided that eliminates the need for a multiplicative extrapolation from a time value to determine the effective signal level within each pixel. This scheme also comprises a photodetector analog output buss, but has the additional function of determining how may times a given pixel reached the programmed threshold value rather than the time required to reach the threshold value. This is done by resetting the photodetector each time the photodetector reaches the programmed threshold value, and having a signal in the pixel indicative of the number of times that the photodetector was reset in the integration period.

ADVANTAGES OF THE PRESENT INVENTION

The present invention provides the advantages of extending the dynamic range of an APS while retaining small pixel size and low noise. These embodiments do not require a large counter in the pixel and also provide a low noise analog photodetector signal readout. This provides an area efficient extended dynamic range sensor for which very simple or no auto exposure control is required.

BRIEF DESCRIPTION OF THE DRAWINGS

FIGS. 4a–c are timing diagrams of the operation of the pixel shown in FIG. 3a;

DETAILED DESCRIPTION OF THE INVENTION

The new sensor architecture is preferably for a sensor that is arranged in an array having y rows and x columns, however, it will be understood by those skilled in the relevant art that other arrangements can also be used such as linear sensors.

Figure 3A:
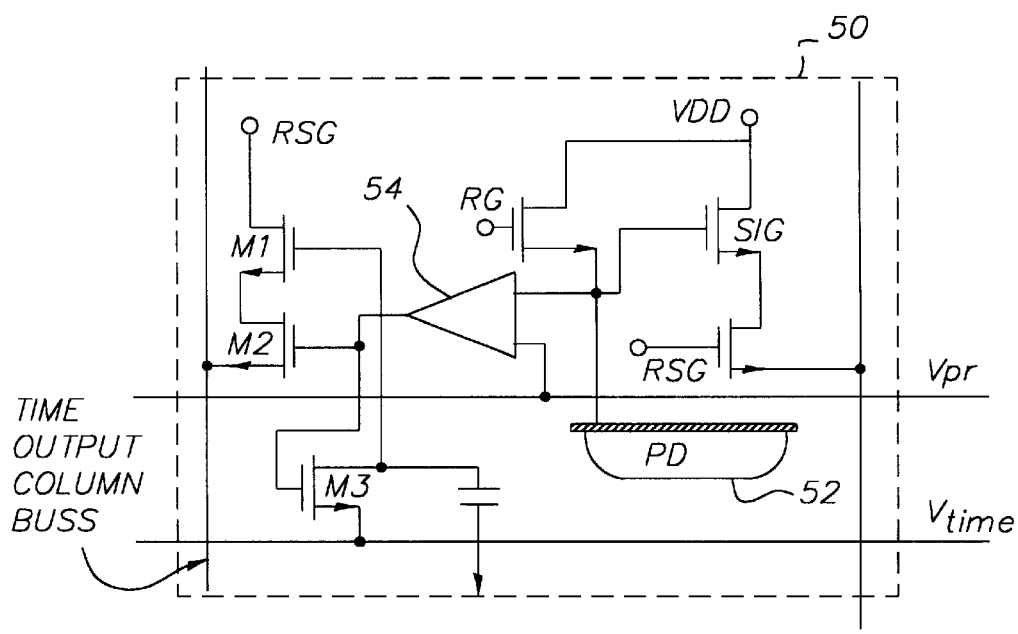
FIGS. 3a–e are diagrams of the pixel architectures of preferred embodiments of the present invention.
Figure 4A:
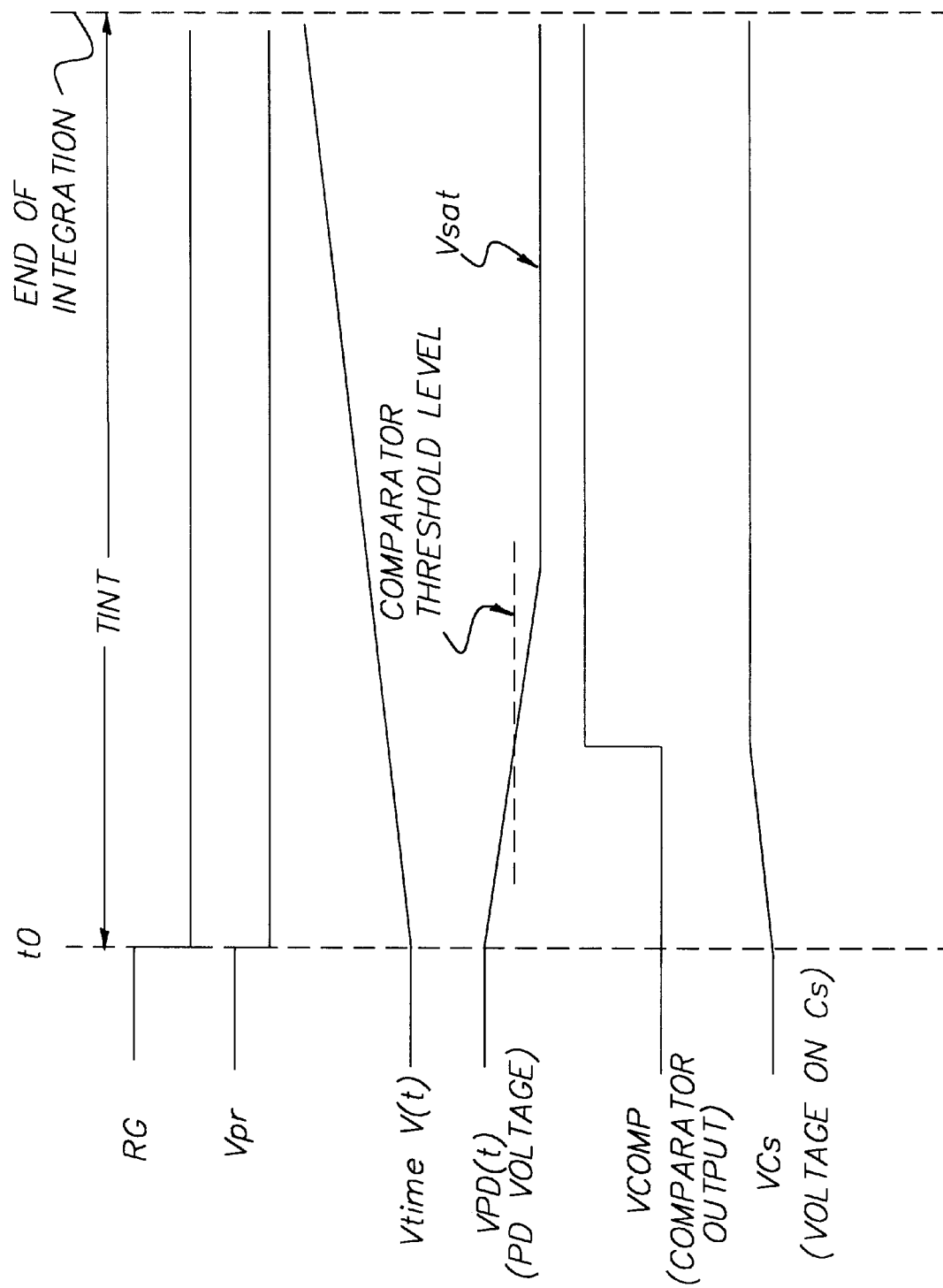
Figure 4B:
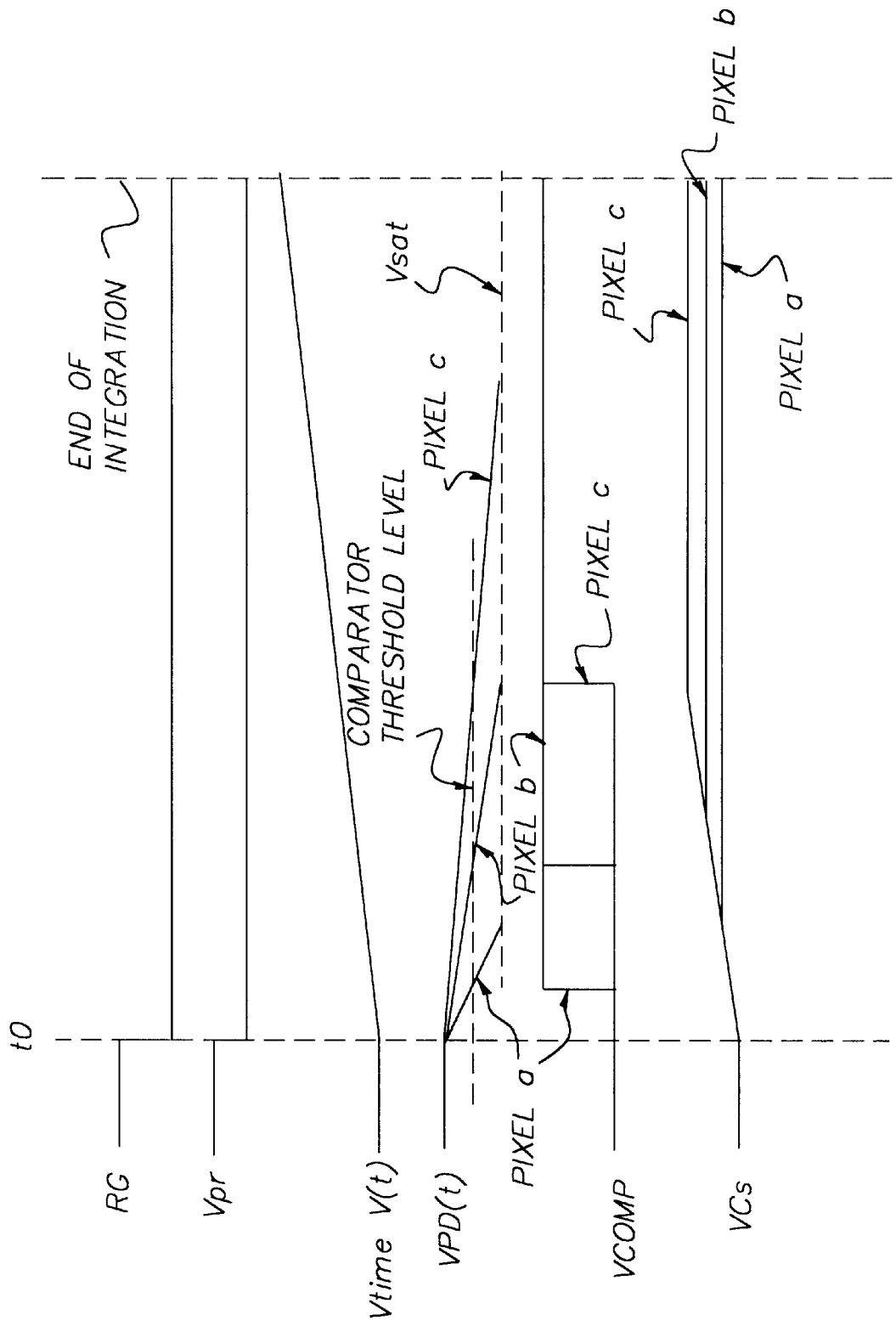

The new APS pixel and sensor architecture provides extended dynamic range while overcoming the limitations of the prior art. Referring to FIG. 3a, a new pixel architecture that provides for a high dynamic range sensor is provided. In this architecture, the pixel 50 comprises a photodetector PD, (typically a photodiode), a reset transistor with a reset gate RG, a source follower input transistor SIG, a row select transistor with a row select gate RSG, a comparator, a buss Vpr to provide a voltage input to one input of the comparator, a second source follower input transistor M1, a storage capacitor Cs, a buss Vtime to provide a time dependent voltage signal V(t) to the storage capacitor, a switch M3 connecting the storage capacitor to the time dependent voltage buss, and a second row select transistor M2. The second input to the comparator is connected to the photodetector. The pixel operates in the following manner. Refer to the timing diagram in FIG. 4a. Initially the PD, comparator and Cs are reset to predetermined levels by application of the required signals to RG, Vpr and Vtime respectively. At this point the PD is operatively empty, the comparator output is a logical "0", and Cs is connected to Vtime. At time t0, image capture commences. Incident light produces photoelectrons within the pixel that are collected in PD. As the charge accumulated in PD 52 increases, the voltage applied to the positive input of the comparator gets closer to Vpr and the comparator switching threshold level. Also as time elapses the voltage level V(t) on Vtime changes. If the incident light is bright enough to create enough electrons in the integration time Tint, such that the VPD(t) signal exceeds the threshold value that is applied to comparator 54, the comparator 54 switches state and disconnects the storage capacitor Cs from V(t) that is applied via Vtime 51. Now the pixel storage capacitor Cs is floating and remains at the voltage that was last applied Vtime 51, V(t) at t=Tint, when the charge accumulated in the photodetector 52 exceeded the threshold value supplied to comparator 54. Referring to FIG. 4b, the case for 3 bright pixels is shown. Pixel A is brighter than Pixel B which is brighter than Pixel C. As shown, the comparators for Pixels A, B and C will trip at different times producing different voltages VCs stored on the respective storage capacitors.

Figure 4C:
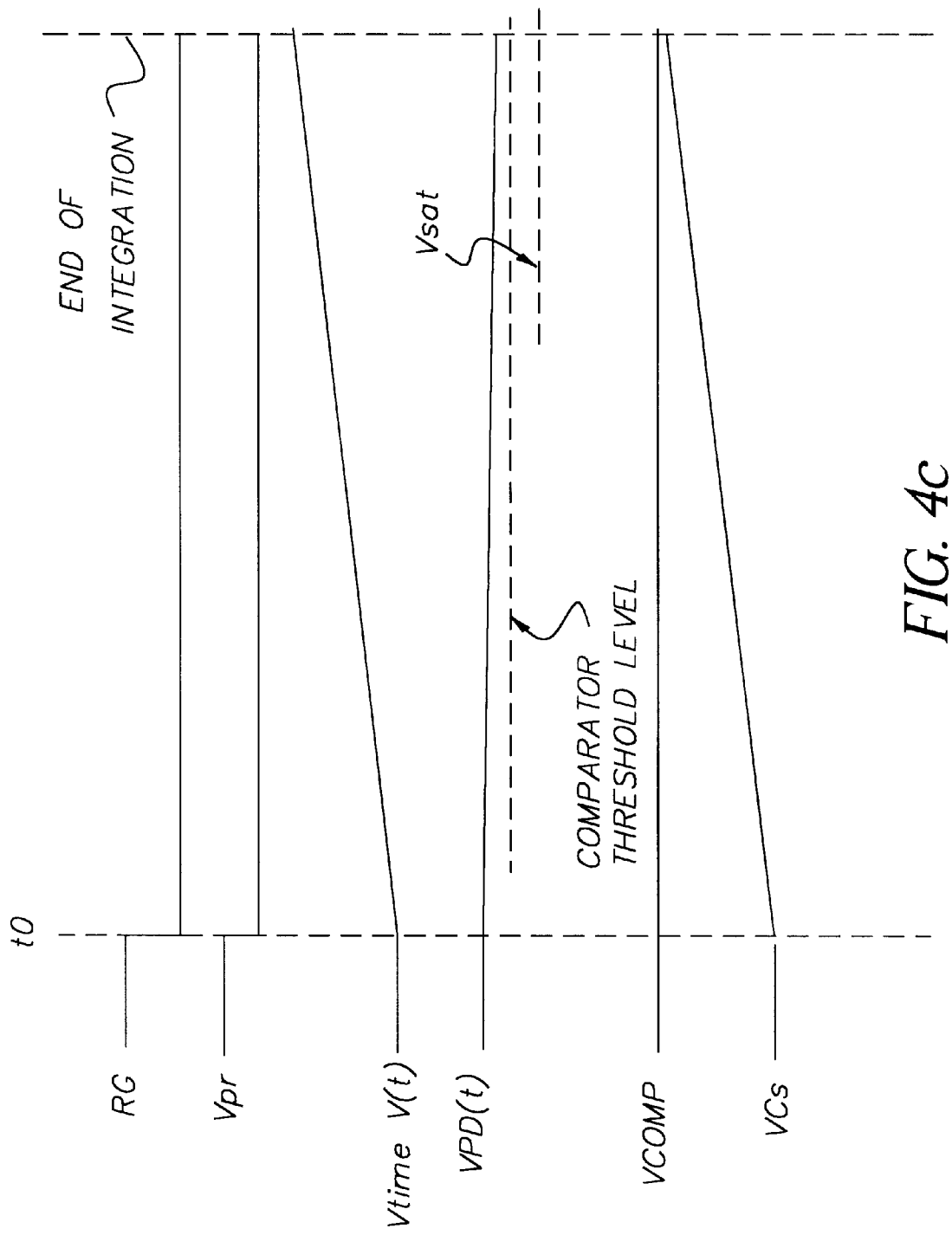

If the incident light is not bright enough to cause the PD voltage level to exceed the threshold level, the comparator will not change state and Cs remains connected to Vtime. This is shown in FIG. 4c. At the end of the desired integration time, each pixel of the sensor is then read out one row at a time by application of a predetermined RSG signals to the appropriate rows. If the comparator has not "tripped", transistor M2 is turned off and the time output column buss is pulled to a low voltage by a per column source follower load transistor connected to the time output column buss and located at the bottom of the pixel array. If the comparator has tripped, transistor M2 will be turned on and the time output column buss will go to a voltage proportional to the voltage of the storage capacitor Cs, that is also interpreted as a logical "1". If the comparator 54 for pixel 60 has "tripped" the value of the storage capacitor Cs is read out through the time output column buss and recorded. If the comparator 54 for that pixel has not "tripped", the value of the signal level for the photodetector 52 is readout through the signal output column buss and recorded. The readout of these analog signals representing time to threshold or signal level in the photodetector can be done in a manner similar to that for prior art APS.

Figure 1:
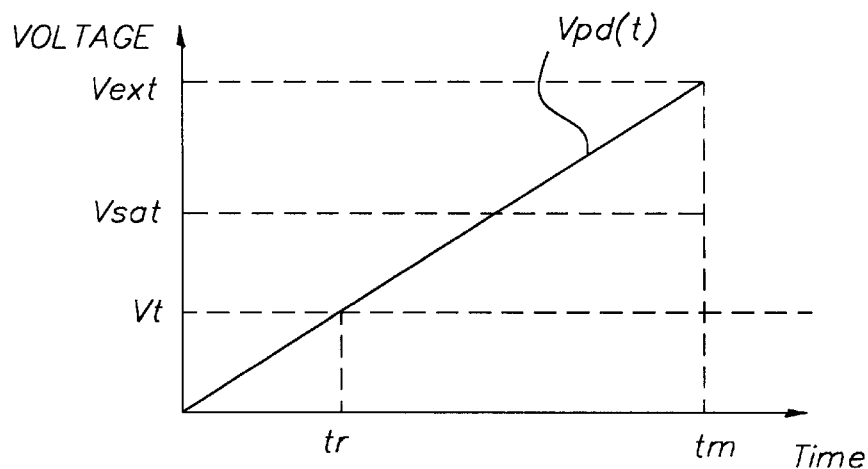
FIG. 1 is a graph defining the variables used in the invention to provide extended dynamic range of the prior art and the present invention.
Figure 2:
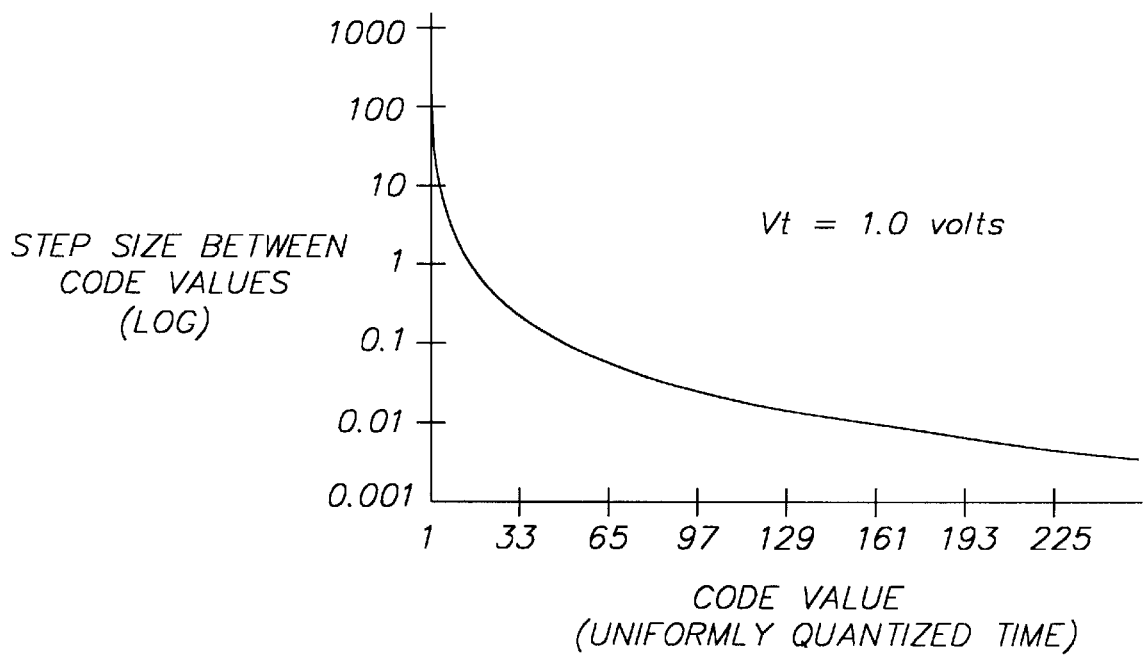
FIG. 2 is a diagram demonstrating the quantization deficiency of the prior art.

Since pixels in bright regions of the image have an analog signal indicative of the time at which the pixel reached a certain signal level, the effective PD signal level of bright regions within the image can be ascertained, and detail associated with these bright regions is maintained. The effective PD signal value at this pixel, $V_{ext}$, can be calculated as seen in the chart of FIG. 1, and determined by the relationship shown in Equation 2, where $V_T$ is the PD signal value at which the Cs is disconnected from Vtime and V(t), $t_M$ is the integration time or exposure time, and $t_T$ is the time required for the pixel to reach $V_T$. $t_T$ can be calculated by inverting the V(t) function applied to Vtime as shown in Equation 6 below.

$$t_T = V^{-1}(t) \qquad \text{Equation 6}$$

Since there is additionally a readout of the photodetector analog signal values for the pixels in the low light regions of the scene, the details of the dark regions are therefore also known and obtained. Assuming that there are 8–10 bits of image data associated with the bright regions of the image, and there are 8–10 bits of image data associated with the darker regions of the image, these two sets of image data can be concatenated to provide a total of 16–20 bits of scene detail information. This leads to a sensor with extremely high dynamic range.

It should be noted that the readout of the level of photodetector 52 could also be done in addition to or in parallel with readout of the storage capacitor Cs level for pixels that have tripped the comparator 54. This provides 2 data values that are then available from the same pixel. One data value is representative of the time to reach the threshold that is applied to comparator 54 and the other data value is representative of the signal that has integrated within photodetector 52. These values can be used in concert to perform functions such as calibration. For example, if the threshold level were set to be 50% of the Vsat of the photodetector, the signal from Cs and the PD for a pixel that reached 75% of Vsat can be compared and used to provide an accurate calibration of the signals indicative of time to threshold and the amount of charge in the PD.

Figure 3B:
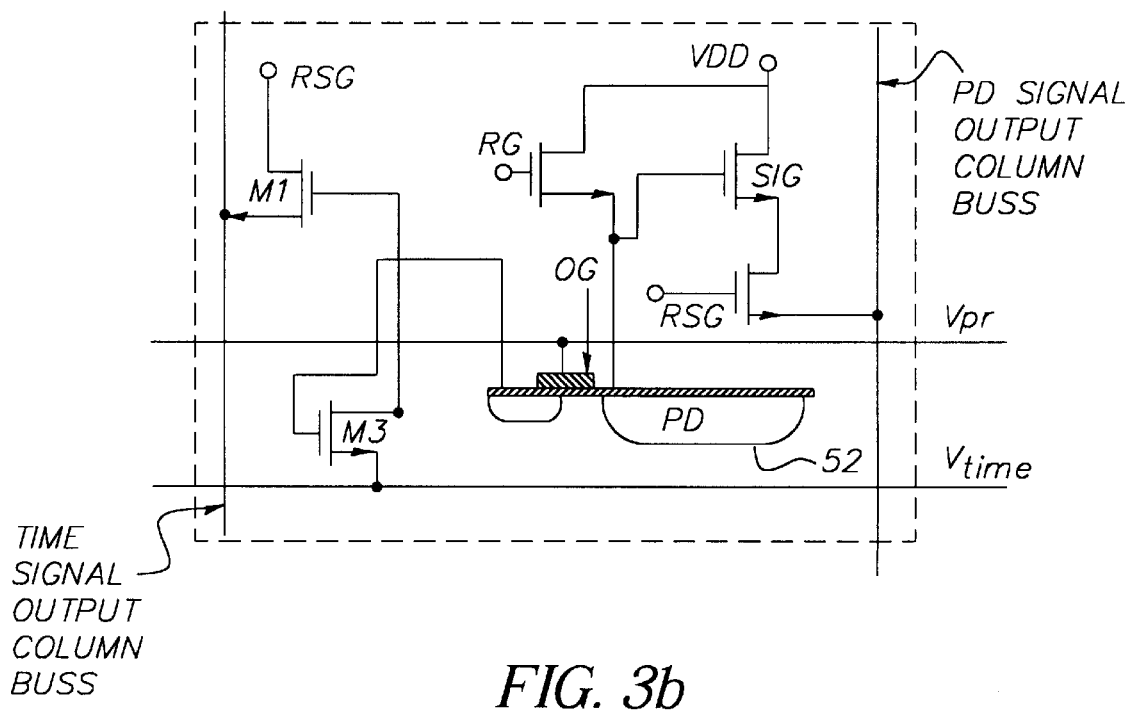

Another embodiment of this pixel architecture is shown in FIG. 3b. In this case the comparator within the pixel is eliminated and replaced by an overflow gate OG adjacent to the PD, and a floating diffusion. The threshold buss Vpr is connected to the OG, and the floating diffusion is connected to the input of the switch M3 between V(t) and Cs. In FIG. 3b Cs is simply the input capacitance of transistor M1. Operation occurs in a manner similar to that described for the pixel in FIG. 3a. Initially the PD and FD are reset. The FD is now close to VDD and the switch transistor M3 is turned on connecting Cs to V(t). The potential of the region under OG is controlled by Vpr. As integration proceeds, PD will begin to collect photoelectrons. If the number of electrons in PD causes the PD potential to exceed that of the region under OG, then the additionally created photoelectrons will flow from the PD through the region under OG to the FD. When the number of electrons in the FD causes the potential of the FD to go below the threshold voltage of M3, M3 will turn off thus disconnecting Cs from V(t). Now the voltage stored on Cs is indicative of the elapsed time to reach a predetermined signal level. In this embodiment, neither a counter or a comparator is used, providing a 6 transistor pixel. This enables a high fill factor small pitch pixel suitable for consumer digital still camera applications.

Figure 3C:
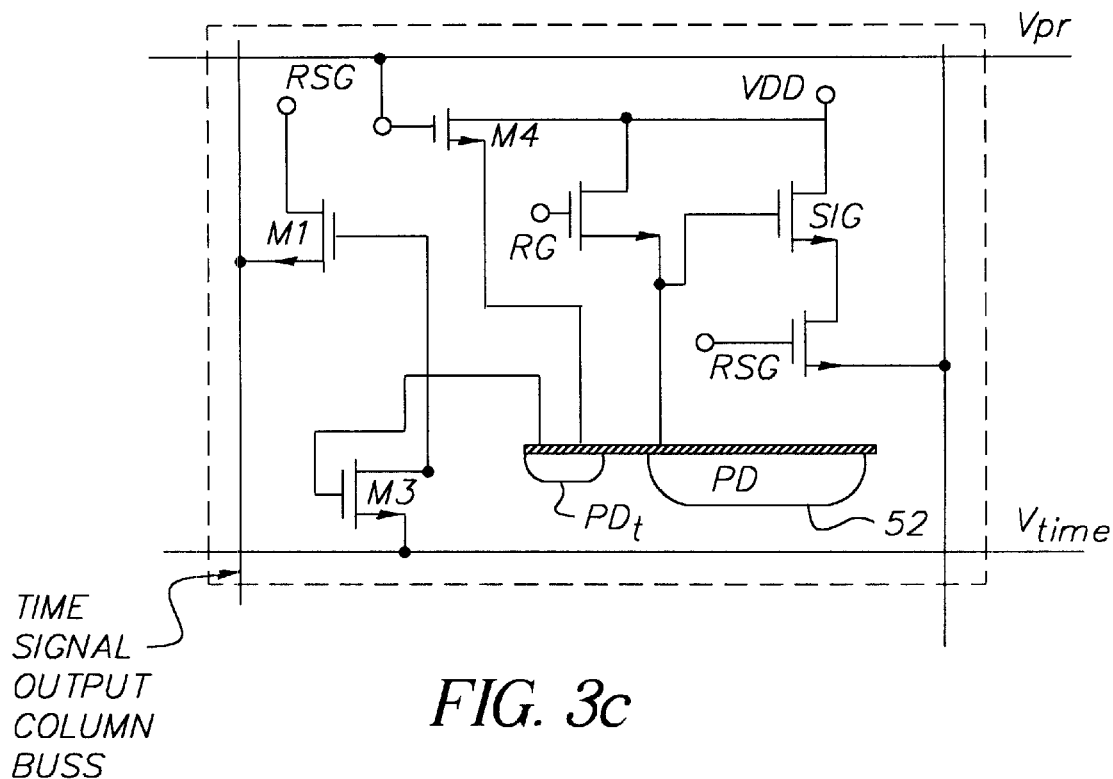
Figure 3D:
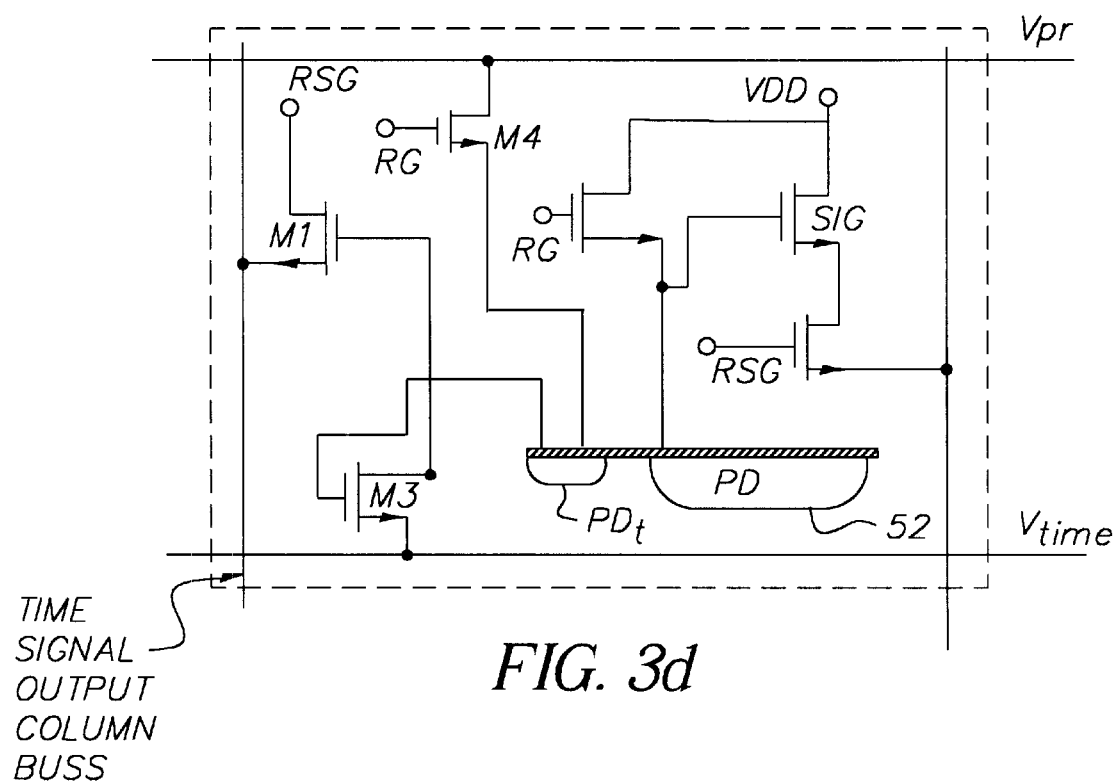
Figure 3E:
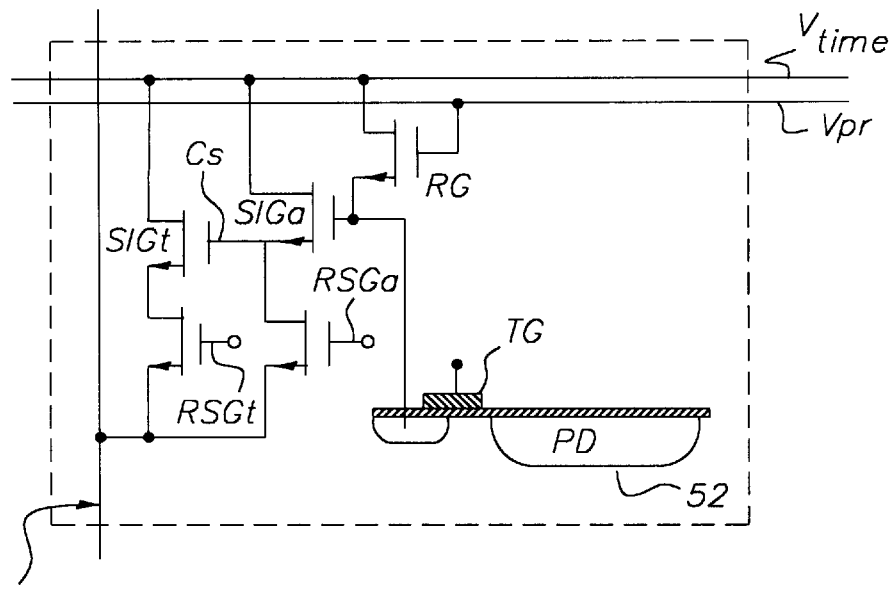

A third embodiment of the same concept is shown in FIG. 3c and 3d. In this case a separate PD is formed to create a PD to determine time to threshold. This will be referred to as PDt. At the commencement of operation both PD and PDt are reset to predetermined levels respectively. The programmable threshold buss Vpr is connected to the gate of a second reset transistor M4, and controls the level to which PDt is reset to. As integration proceeds, PDt and PD will both collect photoelectrons. When the number of electrons in the PDt causes the potential of PDt to go below the threshold voltage of M3, M3 will turn off thus disconnecting Cs from V(t). Now the voltage stored on Cs is indicative of the elapsed time to reach a predetermined signal level. The amount of charge required to make the potential of PDt less than the threshold voltage of M4 is controlled by the level to which PDt is reset to. The number of photoelectrons in PD are read out in the previously described manner providing a signal level indicative of the number of electrons stored in PD. By designing the size and capacity of PDt appropriately one can ensure that the time to reach threshold $t_T$, will be less than the desired integration time $t_M$. The pixel shown in FIG. 3d is identical to that shown in FIG. 3c except that the Vpr is connected to the drain of reset transistor M4 rather than the gate. The RG of M4 is connected to the same signal as the RG for reset transistor #. The reset level of PDt is still controlled by the voltage applied to Vpr.

Another embodiment of this same concept is provided in FIG. 4e. In this embodiment a single column output buss is used to readout the signal indicative of time to threshold and the signal indicative of the number of electrons stored in the photodetector sequentially. The pixel comprises a photodetector PD, transfer gate TG, floating diffusion FD, a reset transistor with a reset gate RG, a row select transistor RSGt to readout signals indicative of time to threshold a row select transistor RSGa to readout signals indicative of the analog charge within the photodetector PD. FD is designed to operate as a photodetector. Operation of this pixel occurs in the following manner. Initially both PD and FD are reset by turning RG on and TG on and applying VDD to Vtime. The level of the FD can then be separately reset by turning TG off, and applying a second predetermined signal level to Vpr with Vtime at VDD. Integration then commences by turning RG off and applying V(t) to Vtime. Both PD and FD begin to collect photoelectrons. Since the level of FD is above the threshold of SIGa, SIGa serves as a switch connecting the V(t) applied to Vtime to Cs which is the input capacitance of SIGt. When the number of photoelectrons collected in FD cause the potential of FD to go below the threshold voltage SIGa, SIGa will turn off and the voltage level stored on Cs is indicative of the time to threshold. At the end of the integration period, the sensor is read out by setting RSGt high and reading out the signal level stored on Cs. The FD is then reset by turning RG on and setting Vtime to VDD. This provides a reset level to readout through SIGt, and provides a differential readout of the signal indicative of time to threshold in order to cancel the pixel source follower offset. Now that the FD is reset, the reset level is readout by source follower SIGa by turning RGSt off and RSGa on. Charge in PD is then transferred to the FD by strobing Tg on and off. The signal level on the FD is then readout via the source follower SIGa. This provides correlated double sampled readout of the analog signal level of the photodetector.

It should be noted that the threshold value at which Cs is disconnected from V(t) is programmable and can be set by the system to provide optimum performance. In addition, the time dependent voltage signal V(t) applied can be made to be any arbitrary user defined transfer function that provides further extension of dynamic range and to manage the quantization of the time signal. For example the V(t) could be a logarithmic function to provide extension of the range of illuminance that can be discerned in the bright regions of the scene. Additionally, multiple Vpr signals or signal lines could be provided to have separate programmable threshold values for each color pixel in the image sensor array.

Since the time values required to reach a threshold level are stored for bright regions of the scene, all of the detail associated with these bright regions is maintained. Since the analog signal values for the low light regions of the scene are known, the details of the dark regions are therefore also known and obtained. This leads to a sensor with extremely high dynamic range. Assuming that there are 10 bits of temporal data, and the remaining analog signal, (i.e. those values that did not exceed the comparator threshold level), are quantized into 8–10 bits, the measured signal is extended beyond $V_T$ by 8–10 bits. It should be noted again that the comparator threshold value is programmable and can be set by the system to provide optimum performance.

Figure 5:
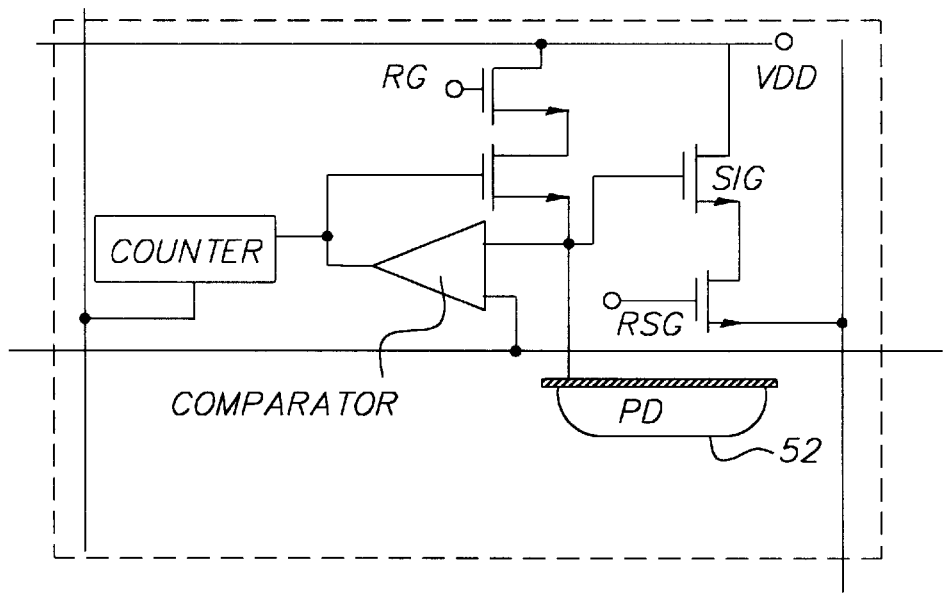
FIG. 5 is a diagram of another pixel architecture as envisioned by the present invention.

Another means to accomplish high dynamic range for an APS pixel is similar to those described above except that the comparator 54 output is used to (1) increment a counter and (2) reset the photodetector as seen in FIG. 5. In this type of embodiment, a counter value is associated with each pixel. At the end of the integration time for a frame capture the counter value is read out via the digital output buss, and the value represents the number of times that the photodetector filled to the threshold level and was reset. The output voltage of the photodetector is read out via the analog output buss and represents the amount of charge collected since the photodetector was last reset. The total output value of the pixel is then the number of times it reached the programmed threshold value plus the voltage in the photodetector from the analog output buss. For example assume the programmed threshold level is 500 mV. A very bright region may have a counter value of 1245 and an analog output of 300 mV. A less bright region may have a counter value of 100 and an analog output of 100 mV. A dim region may have a counter value of 0 and an analog output of 200 mV. The output voltages would then be calculated using the formula, Vout=(counter value)(500)+(analog output value).

The foregoing description details the embodiments most preferred by the inventor. Variations of these embodiments will be readily apparent to those skilled in the art. Accordingly, the scope of the invention should be measured by the appended claims.

| PARTS LIST | |
|---|---|
| 10 | photosite timer |
| 12 | comparator |
| 14 | photosite |
| 15 | reset gate |
| 18 | reset drain |
| 21 | source follower transistor |
| 23 | transfer gate |
| 25 | floating diffusion |
| 26 | row select and photogate signal buss |
| 32 | integrator |
| 34 | flag |
| 50 | pixel |
| 52 | photodetector |
| 53 | reset transistor |
| 54 | comparator |
| 56 | amplifier |
| 60 | pixel |
| 62 | source follower amplifier |
| 65 | transistor |
| 66 | signal transistor (SIG) |
| 67 | row select transistor (RSG) |
| SHS | sample hold signal transistor |
| CS | signal storage capacitor |
| SHR | sample hold reset transistor |
| CR | reset storage capacitor |

What is claimed is:

1. An active pixel sensor having a plurality of pixels with at least one pixel comprising:

a photodetector operatively coupled to a reset device;

a threshold level coupled to the photodetector and a device that indicates when the photodetector has reached the threshold level; and an analog detector interfacing the photodetector signal to a signal buss.

2. The invention of claim 1 wherein the device further comprises a comparator connected to the threshold level.

3. The invention of claim 2 wherein the device further comprises:

the comparator being connected to the threshold level such that the comparator will trigger when the photodetector potential reaches the level of the threshold buss; and an interface between the comparator output of the pixel and the active pixel sensor identifying when the photodetector reaches the threshold buss potential.

4. The invention of claim 1 wherein the active pixel sensor further comprises means for combining the signals from the device and the signal buss to arrive at a combined signal level representing an extended dynamic range of the photodetector.

5. The invention of claim 2 wherein the photodetector is reset upon the comparator firing and the interface is connected to means for cumulatively combining repetitive firings of the comparator yielding a further increase in the dynamic range of the photodetector.

6. The invention of claim 5 wherein the photodetector is not reset upon firing of the comparator.

7. The invention of claim 3 wherein the interface further comprises a capacitive element electrically connected to a time dependent signal, the capacitive element operative to store a voltage that is indicative of time required for the photodetector to reach the threshold level.

8. The invention of claim 7 wherein the interface further comprises a bus supplying a varying analog voltage to the capacitive element.

9. The invention of claim 8 wherein the interface further comprising a transistor the selectively connects and disconnects the capacitive element from the varying analog voltage bus upon respective reset and achievement of threshold levels of the photodetector.

10. The invention of claim 9 wherein the capacitive elements retains a voltage of the varying analog voltage bus at the time when the photodetector reached the threshold level.

11. An active pixel sensor having a plurality of pixels with at least one pixel comprising:

a photodetector operatively coupled to a reset device;

a threshold level coupled to the photodetector and a device that indicates when the photodetector has reached the threshold level and the photodetector is reset each time the device indicates that the photodetector has reached the threshold level;

an analog detector interfacing the photodetector signal to a signal buss; and means for determining the number of times the photodetector has reached the threshold level.

* * * * *